United States Patent
Nakamura et al.

(10) Patent No.: US 12,203,775 B2
(45) Date of Patent: Jan. 21, 2025

(54) APPARATUS, POWER SUPPLY CIRCUIT, PHOTOELECTRIC CONVERSION DEVICE, IMAGING DEVICE AND MOVABLE OBJECT

(71) Applicant: CANON KABUSHIKI KAISHA, Tokyo (JP)

(72) Inventors: Kohichi Nakamura, Kanagawa (JP); Masaki Sato, Kanagawa (JP); Daisuke Kobayashi, Saitama (JP); Tetsuya Itano, Kanagawa (JP); Daisuke Yoshida, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/769,598

(22) PCT Filed: Oct. 29, 2020

(86) PCT No.: PCT/JP2020/040600
§ 371 (c)(1),
(2) Date: Apr. 15, 2022

(87) PCT Pub. No.: WO2021/085527
PCT Pub. Date: May 6, 2021

(65) Prior Publication Data
US 2024/0133686 A1  Apr. 25, 2024
US 2024/0230326 A9  Jul. 11, 2024

(30) Foreign Application Priority Data
Oct. 30, 2019 (JP) .................... 2019-197616

(51) Int. Cl.
*G01C 3/02* (2006.01)
*H03F 3/45* (2006.01)
(Continued)

(52) U.S. Cl.
CPC ........... *G01C 3/02* (2013.01); *H03K 17/6871* (2013.01); *H04L 25/0272* (2013.01);
(Continued)

(58) Field of Classification Search
None
See application file for complete search history.

(56) References Cited

U.S. PATENT DOCUMENTS 5,689,460 A * 11/1997 Ooishi .................. G11C 5/143
327/535
7,952,409 B2   5/2011 Yoshida
(Continued)

FOREIGN PATENT DOCUMENTS

JP   H08-190437 A   7/1996
JP   2005-223872 A   8/2005
(Continued)

OTHER PUBLICATIONS

U.S. Appl. No. 17/704,221, filed Mar. 25, 2022, Hideo Kobayashi.
(Continued)

*Primary Examiner* — Jany Richardson
(74) *Attorney, Agent, or Firm* — VENABLE LLP

(57) ABSTRACT

The disclosed apparatus includes a plurality of differential transmitters, and a power supply circuit that supplies a power supply voltage to each of the plurality of differential transmitters. The power supply circuit includes a common circuit unit that defines the power supply voltage supplied to the plurality of differential transmitters, and a plurality of individual circuit units provided in association with the plurality of differential transmitters and each connected to the common circuit unit. Each of the plurality of individual circuit units has an output node that outputs the power supply voltage defined by the common circuit unit to a corresponding differential transmitter of the plurality of (Continued)

differential transmitters, and respective output nodes of the plurality of individual circuit units are connected to each other.

15 Claims, 11 Drawing Sheets

(51) Int. Cl.
    *H03K 17/687*     (2006.01)
    *H03K 19/0175*     (2006.01)
    *H04L 25/02*     (2006.01)
    *H04N 25/709*     (2023.01)
    *H04N 25/78*     (2023.01)

(52) U.S. Cl.
    CPC ....... *H04L 25/0282* (2013.01); *H04N 25/709* (2023.01); *H04N 25/78* (2023.01); *H03F 3/45475* (2013.01)

(56) References Cited

U.S. PATENT DOCUMENTS

| | | | |
|---|---|---|---|
| 8,237,480 B2 | 8/2012 | Yoshida | |
| 9,635,298 B2 | 4/2017 | Nakamura | |
| 11,140,348 B2 | 10/2021 | Totsuka | |
| 2009/0051416 A1 | 2/2009 | Ibuka | |
| 2016/0286152 A1 | 9/2016 | Kobayashi | |
| 2018/0131330 A1 | 5/2018 | Itabashi | |
| 2018/0139076 A1* | 5/2018 | Watabe | H04L 25/0272 |
| 2019/0312071 A1 | 10/2019 | Yamasaki et al. | |

FOREIGN PATENT DOCUMENTS

| | | | |
|---|---|---|---|
| JP | 2008-003787 A | 1/2008 | |
| JP | 2009-37372 A | 2/2009 | |
| JP | 2009-49789 A | 3/2009 | |
| JP | 2014-230059 A | 12/2014 | |
| JP | 2018-36348 A | 3/2018 | |
| JP | 2018-78495 A | 5/2018 | |
| JP | 2018-85713 A | 5/2018 | |
| JP | 2019-186738 A | 10/2019 | |
| WO | 2019/111462 A1 | 6/2019 | |

OTHER PUBLICATIONS

International Search Report dated May 12, 2022 in International Application No. PCT/JP2020/040600 (English translation included).
Japanese Office Action issued Oct. 19, 2023 during prosecution of related Japanese Application No. 2019-197616 (English-language machine translation included).

* cited by examiner

APPARATUS, POWER SUPPLY CIRCUIT, PHOTOELECTRIC CONVERSION DEVICE, IMAGING DEVICE AND MOVABLE OBJECT

This application is a National Stage Application under Section 371 of International Patent Application No. PCT/JP2020/040600, filed Oct. 29, 2020, which claims priority to Japanese Patent Application No. 2019-197616 filed on Oct. 30, 2019, the contents of each of which are incorporated by reference herein.

TECHNICAL FIELD

The aspect of the embodiments relates to a differential signal drive circuit and a photoelectric conversion device.

BACKGROUND ART

In recent years, differential signal transmission schemes such as a Low Voltage Differential Signaling (LVDS) scheme or a Scalable Low Voltage Signaling (SLVS) scheme have been widely used as a high speed data communication scheme. Patent Literature 1 discloses an LVDS driver that suppresses variation of the output amplitude due to manufacturing variation of resistors.

SUMMARY OF THE INVENTION

The LVDS driver disclosed in Patent Literature 1 is formed of an output circuit and a plurality of control circuits and determines a High level and a Low level of a differential signal output from the output circuit by using the control circuits. When it is not necessary to output data from the LVDS driver, a current path of the output circuit of the LVDS driver may be disconnected for power reduction, for example. In the LVDS driver disclosed in Patent Literature 1, however, when data output is started after recovery from a state where the current path is disconnected, the High level of the differential signal may have a higher voltage than that in the operating state of the LVDS driver immediately after the output is started. The same phenomenon may occur at startup of a power supply or the like.

According to one aspect of the embodiments, provided is an apparatus including a plurality of differential transmitters, and a power supply circuit that supplies a power supply voltage to each of the plurality of differential transmitters. The power supply circuit includes a common circuit unit that defines the power supply voltage supplied to the plurality of differential transmitters, and a plurality of individual circuit units provided in association with the plurality of differential transmitters and each connected to the common circuit unit. Each of the plurality of individual circuit units has an output node that outputs the power supply voltage defined by the common circuit unit to a corresponding differential transmitter of the plurality of differential transmitters, and the output node of one of the plurality of individual circuit units and the output node of another of the plurality of individual circuit units are connected to each other.

Further, according to another aspect of the embodiments, provided is a power supply circuit that supplies a power supply voltage to a plurality of differential transmitters corresponding to a plurality of lanes, and the power supply circuit includes a common circuit unit that defines the power supply voltage supplied to the plurality of differential transmitters, and a plurality of individual circuit units provided in association with the plurality of differential transmitters and each connected to the common circuit unit. Each of the plurality of individual circuit units has an output node that outputs the power supply voltage defined by the common circuit unit to a corresponding one of the plurality of differential transmitters, and the output node of one of the plurality of individual circuit units and the output node of another of the plurality of individual circuit units are connected to each other.

Further features of the disclosure will become apparent from the following description of exemplary embodiments with reference to the attached drawings.

DESCRIPTION OF THE EMBODIMENTS

Exemplary embodiments of the disclosure will now be described in detail in accordance with the accompanying drawings.

First Embodiment

Figure 1:
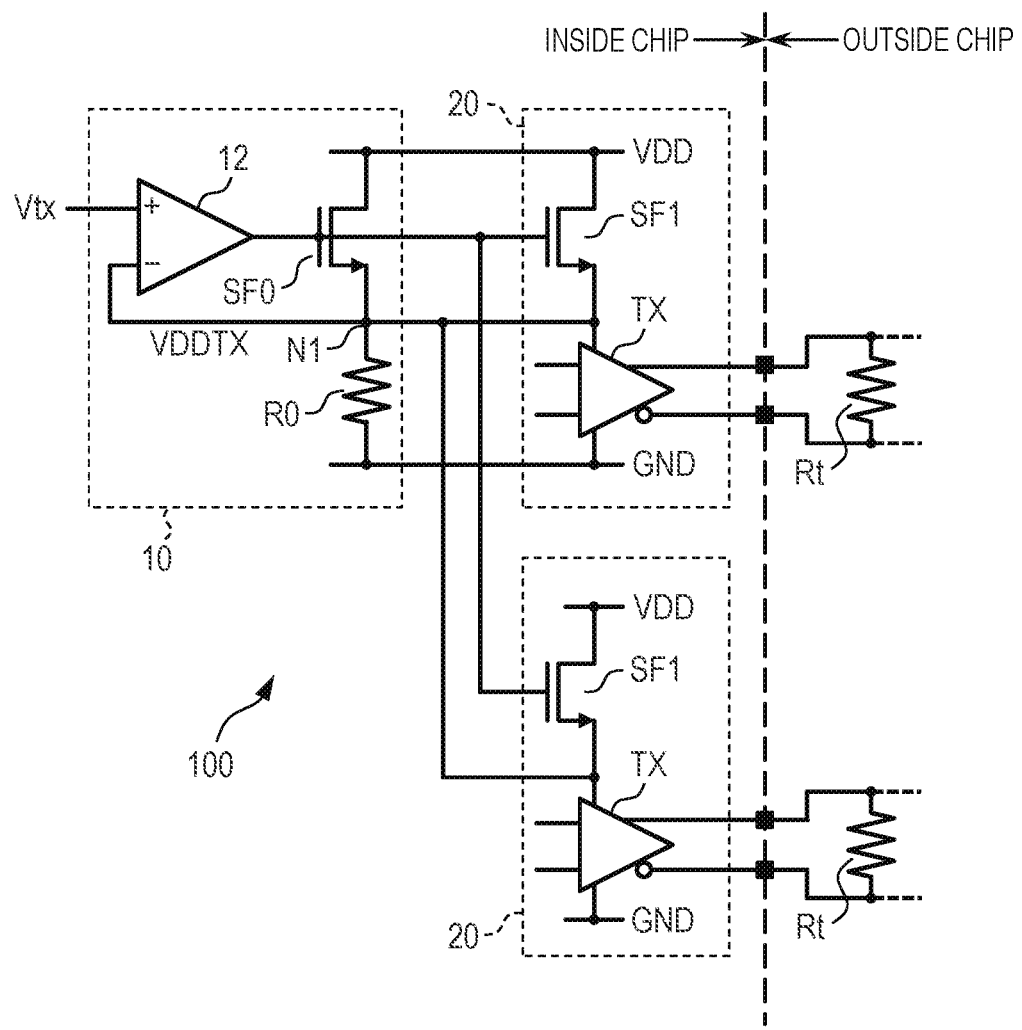
FIG. 1 is a circuit diagram illustrating a general configuration of a differential signal drive circuit according to a first embodiment of the disclosure.
Figure 2:
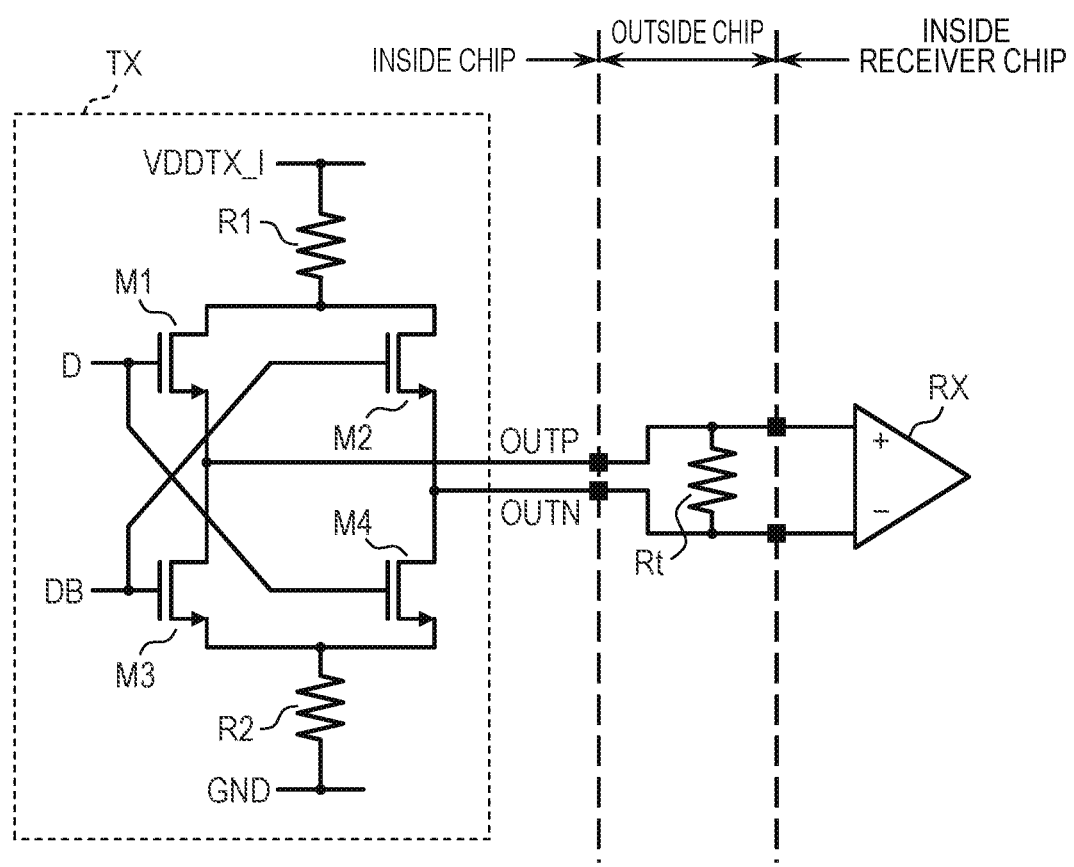
FIG. 2 is a circuit diagram illustrating a configuration example of a differential transmitter in the differential signal drive circuit according to the first embodiment of the disclosure.
Figure 3:
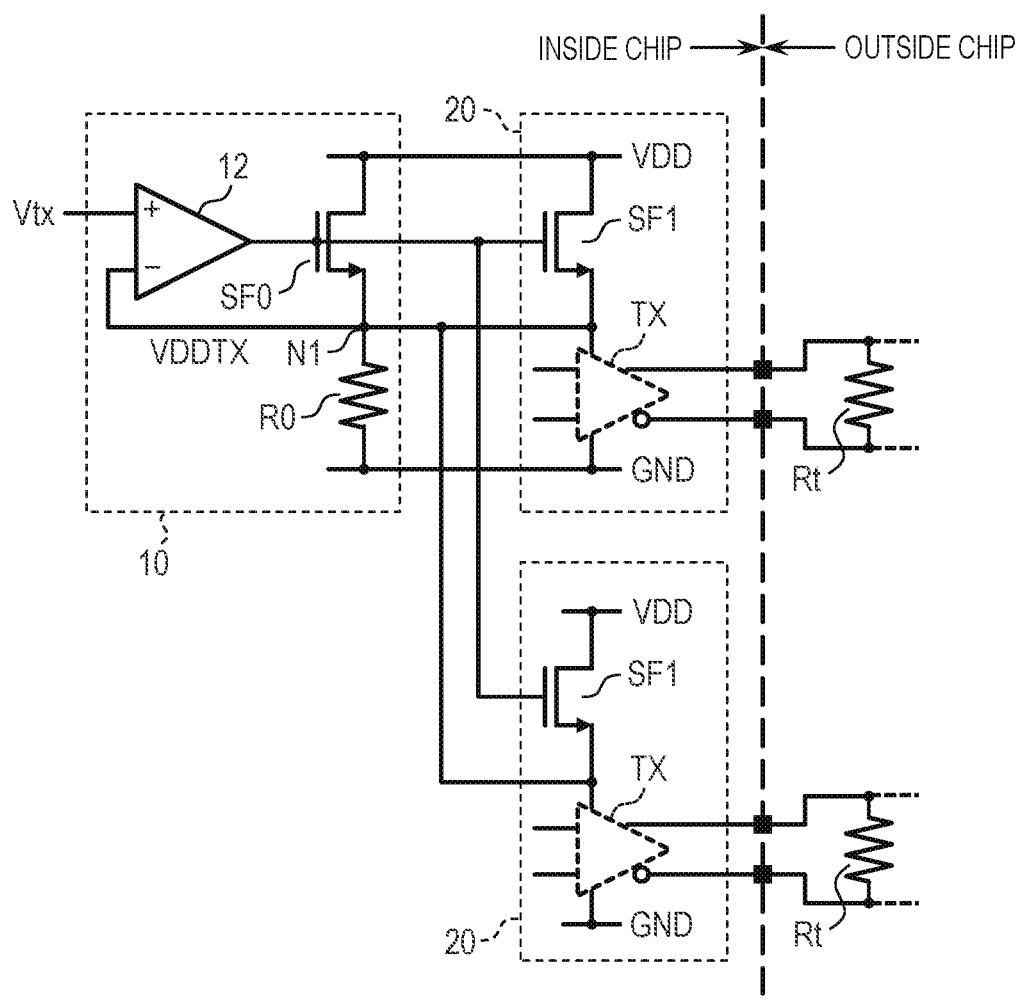
FIG. 3 is a diagram illustrating an operation of the differential signal drive circuit according to the first embodiment of the disclosure.

A differential signal drive circuit according to a first embodiment of the disclosure will be described with reference to FIG. 1 to FIG. 3. FIG. 1 is a circuit diagram illustrating a general configuration of the differential signal drive circuit according to the present embodiment. FIG. 2 is a circuit diagram illustrating a configuration example of the differential transmitter in the differential signal drive circuit according to the present embodiment. FIG. 3 is a diagram illustrating an operation of the differential signal drive circuit according to the present embodiment.

As illustrated in FIG. 1, a differential signal drive circuit 100 according to the present embodiment includes a common circuit unit 10 and a plurality of individual circuit units 20. Each of the plurality of individual circuit units 20 is a circuit block corresponding to one lane. Although only two individual circuit units 20 are illustrated in FIG. 1 for simplified illustration, the number of individual circuit units 20 is not particularly limited and may be increased or reduced as appropriate in accordance with the number of required lanes.

The common circuit unit 10 includes a differential amplifier circuit 12, an n-channel MOS transistor SF0, and a load resistor R0. Each of the plurality of individual circuit units 20 includes an n-channel MOS transistor SF1 and a differential transmitter TX. The common circuit unit 10 defines a power supply voltage to be supplied to a plurality of differential transmitters TX. Further, the n-channel MOS transistor SF1 of the individual circuit unit 20 outputs a power supply voltage defined by the common circuit unit 10 to the corresponding differential transmitters TX. That is, out of circuit elements forming the differential signal drive circuit 100, the common circuit unit 10 and the n-channel MOS transistors SF1 of the individual circuit units 20 form a power supply circuit that supplies a power supply voltage to the power supply voltage terminals of the differential transmitters TX.

The differential amplifier circuit 12 of the common circuit unit 10 has two input terminal (a non-inverting input terminal (+) and an inverting input terminal (−)) and an output terminal. The output terminal of the differential amplifier circuit 12 is connected to the gate of the n-channel MOS transistor SF0. The n-channel MOS transistor SF0 has the drain connected to a power supply voltage node (voltage VDD) and forms a source follower circuit. The source of the n-channel MOS transistor SF0 is connected to one terminal of the load resistor R0 and the inverting input terminal of the differential amplifier circuit 12. The other terminal of the load resistor R0 is connected to the reference voltage node (GND node). In the following description, the connection node of the source of the n-channel MOS transistor SF0, the one terminal of the load resistor R0, and the inverting input terminal of the differential amplifier circuit 12 is referred to as a node N1 for the purpose of illustration.

Note that, although the load resistor R0 is illustrated as a load element connected to the n-channel MOS transistor SF0 in FIG. 1, a different load element, for example, a current source may be connected instead of the load resistor R0.

A reference voltage (voltage Vtx) is supplied to the non-inverting input terminal of the differential amplifier circuit 12. When the voltage of the inverting input terminal of the differential amplifier circuit 12 is denoted as VDDTX, since the differential amplifier circuit 12 is virtually short-circuited, the voltage VDDTX is equal to the voltage Vtx. That is, the voltage of the source of the n-channel MOS transistor SF0, namely, the voltage of the node N1 is the voltage Vtx.

The differential transmitter TX of the individual circuit unit 20 has a power supply voltage terminal, a reference voltage terminal, a pair of differential input terminals, and a pair of differential output terminals. The n-channel MOS transistor SF1 has the drain connected to the power supply voltage node (voltage VDD) and forms a source follower circuit. The gate of the n-channel MOS transistor SF1 is connected to the gate of the n-channel MOS transistor SF0 and the output terminal of the differential amplifier circuit 12. The source of the n-channel MOS transistor SF1 is connected to the node N1 and the power supply voltage terminal of the differential transmitter TX. That is, the source of the n-channel MOS transistor SF1 is an output node that outputs the power supply voltage to the differential transmitter TX.

The reference voltage terminal of the differential transmitter TX is connected to the reference voltage node (GND node). The differential output terminals of the differential transmitter TX are connected to a termination resistor Rt outside a chip on which the differential signal drive circuit 100 is mounted.

In such a way, in the differential signal drive circuit 100 according to the present embodiment, the n-channel MOS transistor SF0 of the common circuit unit 10 and the n-channel MOS transistors SF1 of the individual circuit units 20 are connected such that the gates are commonly connected, the drains are commonly connected, and the sources are commonly connected. Accordingly, the voltage of the source of each of the n-channel MOS transistors SF1, that is, the voltage supplied to the power supply voltage terminal of the differential transmitter TX of each of the individual circuit units 20 is the voltage Vtx.

The differential transmitter TX may be formed of n-channel MOS transistors M1, M2, M3, and M4 and resistors R1 and R2, as illustrated in FIG. 2, for example. The drains of the n-channel MOS transistors M1 and M2 are connected via the resistor R1 to the power supply voltage terminal to which a voltage VDDTX_I is supplied. The source of the n-channel MOS transistor M1 is connected to the drain of the n-channel MOS transistor M3. The source of the n-channel MOS transistor M2 is connected to the drain of the n-channel MOS transistor M4. The sources of the n-channel MOS transistors M3 and M4 are connected to the reference voltage terminal (GND node) via the resistor R2.

Out of the paired differential input terminals, one input terminal to which data D is input is connected to the gate of the n-channel MOS transistor M1 and the gate of the n-channel MOS transistor M4. Out of the paired differential input terminals, the other input terminal to which data DB, which is inverted data of the data D, is input is connected to the gate of the n-channel MOS transistor M2 and the gate of the n-channel MOS transistor M3.

The connection node of the source of the n-channel MOS transistor M1 and the drain of the n-channel MOS transistor M3 is one output terminal of the paired differential output terminals. A signal output from the one output terminal is data OUTP, for example. Further, the connection node of the source of the n-channel MOS transistor M2 and the drain of the n-channel MOS transistor M4 is the other output terminal of the paired differential output terminals. A signal output from the other output terminal is data OUTN, for example. The termination resistor Rt is connected to the differential output terminals outside the chip on which the differential signal drive circuit 100 is mounted. Further, the one output terminal of the differential output terminals is connected to the non-inverting input terminal of a receiver RX arranged on a receiver chip. The other output terminal of the differential output terminals is connected to the inverting input terminal of the receiver RX arranged on the receiver chip.

Next, a voltage Vsigh at the High level of a signal output from the differential transmitter TX will be described with reference to FIG. 2. It is assumed herein that the data D is at the High level and the data DB is at the Low level.

In the differential transmitter TX illustrated in FIG. 2, when the data D at the High level and the data DB at the Low level are input to the differential input terminals, the n-channel MOS transistors M1 and M4 are turned on, and the n-channel MOS transistors M2 and M3 are turned off. Thereby, current flows from the power supply voltage terminal supplied with the voltage VDDTX_I to the reference voltage terminal via the resistor R1, the n-channel MOS transistor M1, the termination resistor Rt, the n-channel MOS transistor M4, and the resistor R2. If it is assumed herein that the channel resistance of the n-channel MOS transistors M1 and M4 can be ignored, the voltage Vsigh can be expressed as Equation (1) below.

$$V\text{sigh}=VDDTX\_I\times(Rt+R2)/(R1+Rt+R2) \quad (1)$$

Herein, a case where the common circuit unit 10 is in an operating state and the differential transmitter TX is in a non-operating state is taken into consideration. Such a case may be, for example, a case at the time of startup of a power supply, a case where it is not necessary to output data to the outside of the chip, or the like.

When the differential transmitter TX is in a non-operating state, a path of current flowing from the power supply voltage terminal is disconnected from the reference voltage terminal in terms of reduction of power consumption. A method for disconnecting a current path may be, for example, a method of controlling both the data D and the data DB at the Low level to turn off all the n-channel MOS transistors M1 to M4. Alternatively, the differential transmitter TX may be configured to have a component that connects the differential output terminals to a fixed potential when the differential transmitter TX is in the non-operating state.

An operation when the common circuit unit 10 is in an operating state and the differential transmitters TX are in non-operating state will be described with reference to FIG. 3. Note that, in FIG. 3, the circuit symbols of the differential transmitters TX are represented by dashed lines in order to visually express that the differential transmitters TX are in the non-operating state and in an open state where a path of current flowing from the power supply voltage terminal to the reference voltage terminal is disconnected.

The sources of the n-channel MOS transistors SF1 of the individual circuit units 20 are commonly connected to the node N1 as described above. Therefore, the voltage VDDTX of the sources of the n-channel MOS transistors SF1 is the voltage Vtx, and the voltage VDDTX_I supplied to the power supply voltage terminals of the differential transmitters TX is also the voltage Vtx.

When the differential transmitter TX transitions to an operating state from this state, the voltage Vtx continues to be supplied to the power supply voltage terminal of the differential transmitter TX. That is, the voltage of the power supply voltage terminal is the voltage Vtx even immediately after the differential transmitter TX recovers to the operating state, and the signal output from the differential transmitter TX is within a desired voltage range as expressed by Equation (1).

Note that, when the differential transmitter TX recovers to the operating state, the resistors R1 and R2 and the termination resistor Rt are connected as a load to the n-channel MOS transistor SF1. Thus, after the recovery, current is supplied to these load resistors through which no current has flowed before the recovery, and this results in a temporary drop of the source voltage of the n-channel MOS transistor SF1. However, because the output voltage of the differential amplifier circuit 12 increases in response to this voltage change, the voltage of the source of the n-channel MOS transistor SF1, that is, the voltage of the power supply voltage terminal of the differential transmitter TX is settled at the voltage Vtx.

Next, the advantageous effect obtained by the differential signal drive circuit according to the present embodiment will be described with reference to FIG. 4 to FIG. 7 in conjunction with comparison with a differential signal drive circuit according to reference examples.

Figure 4:
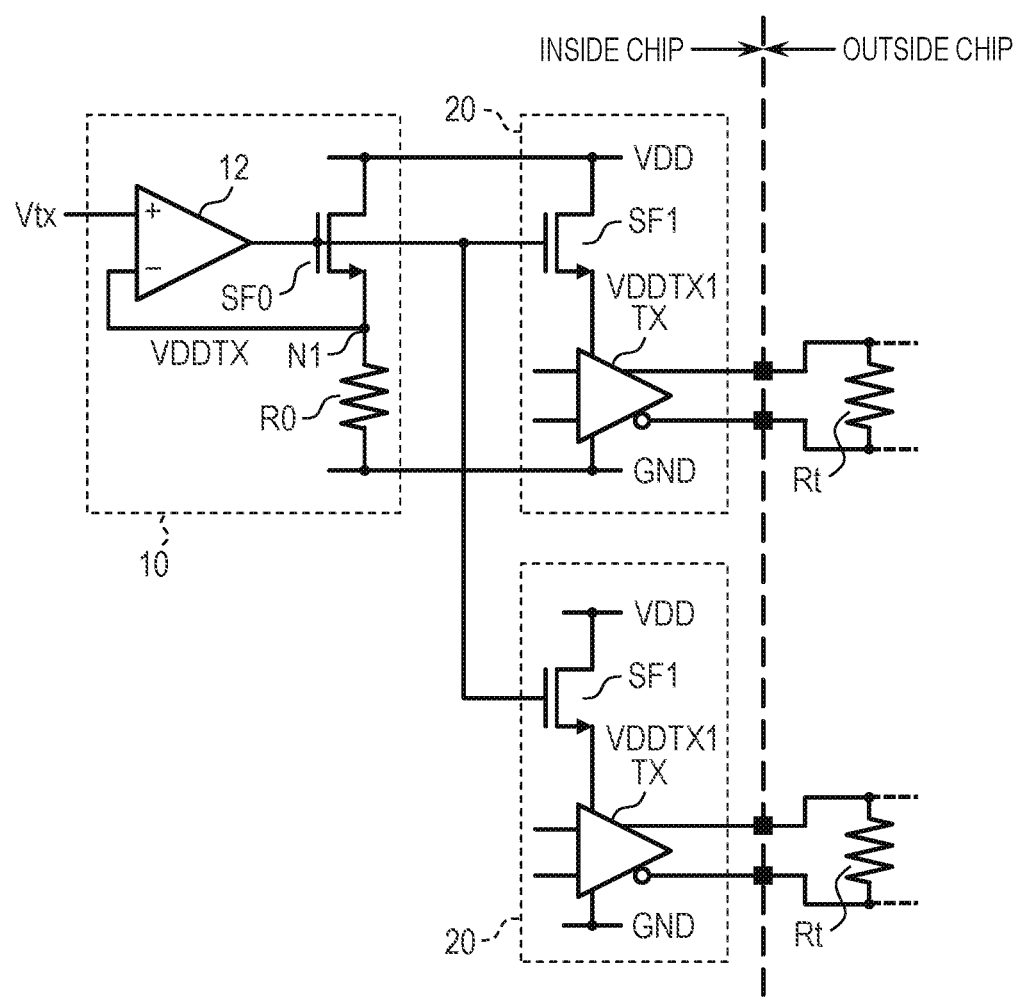
FIG. 4 is a circuit diagram illustrating a general configuration of a differential signal drive circuit according to a first reference example.

The differential signal drive circuit according to a first reference example illustrated in FIG. 4 is different from the differential signal drive circuit according to the present embodiment in that the connection node of the source of the n-channel MOS transistor SF1 of the individual circuit unit 20 and the power supply voltage terminal of the differential transmitter TX is not connected to the node N1. That is, in the differential signal drive circuit according to the first reference example, the voltage VDDTX1 of the source of the n-channel MOS transistor SF1 is a voltage supplied to the power supply voltage terminal of the differential transmitter TX.

In the differential signal drive circuit according to the first reference example, the circuit is designed such that the voltage VDDTX of the source of the n-channel MOS transistor SF0 and the voltage VDDTX1 of the source of the n-channel MOS transistor SF1 are the same when the differential transmitter TX is operating.

The condition by which the voltage VDDTX and the voltage VDDTX1 are the same is expressed by Equation (2) and Equation (3) below.

$$R0=k\times(R1+Rt+R2) \quad (2)$$

$$W0/L0=W1/(k\times L1) \quad (3)$$

Equation (2) is an equation that expresses a relationship between a sum of the resistance R1, the resistance R2, and the termination resistance Rt of the differential transmitter TX and the load resistance R0. Equation (3) is an equation that expresses a relationship between the ratio of the gate width W0 and the gate length L0 (W0/L0) of the n-channel MOS transistor SF0 and the ratio of the gate width W1 and the gate length L1 (W1/L1) of the n-channel MOS transistor SF1. In Equation (2) and Equation (3), k is a constant. When both Equation (2) and Equation (3) are satisfied, the voltage VDDTX of the source of the n-channel MOS transistor SF0 and the voltage VDDTX1 of the source of the n-channel MOS transistor SF1 are the same.

In the differential signal drive circuit according to the first reference example, an operation when the differential transmitter TX transitions from the non-operating state to the operating state will be described with reference to FIG. 5. Note that, in FIG. 5, the circuit symbols of the differential transmitters TX are represented by dashed lines in order to visually express that the differential transmitters TX are in the non-operating state and in an open state where a path of current flowing from the power supply voltage terminal to the reference voltage terminal is disconnected.

Figure 5:
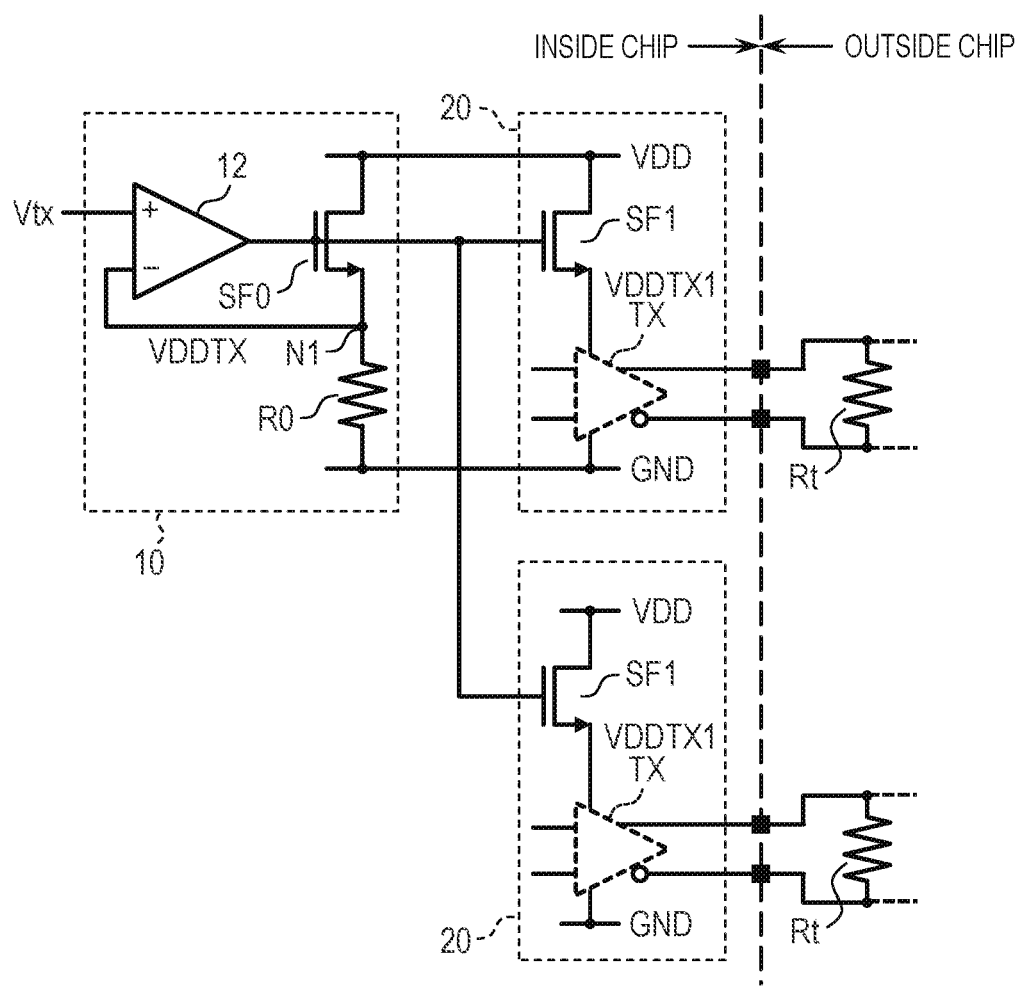
FIG. 5 is a diagram illustrating an operation of the differential signal drive circuit according to the first reference example.

In the differential signal drive circuit according to the first reference example, when the differential transmitter TX is in the non-operating state, the source of the n-channel MOS transistor SF1 of the individual circuit unit 20 is in the open state, as illustrated in FIG. 5. Therefore, no current flows in the n-channel MOS transistor SF1, and the voltage VDDTX1 of the source of the n-channel MOS transistor SF1 is higher than that when the differential transmitter TX is operating. That is, the voltages of respective points satisfy the relationship illustrated in Equation (4) below.

$$VDDTX1>VDDTX=Vtx \quad (4)$$

Figure 6:
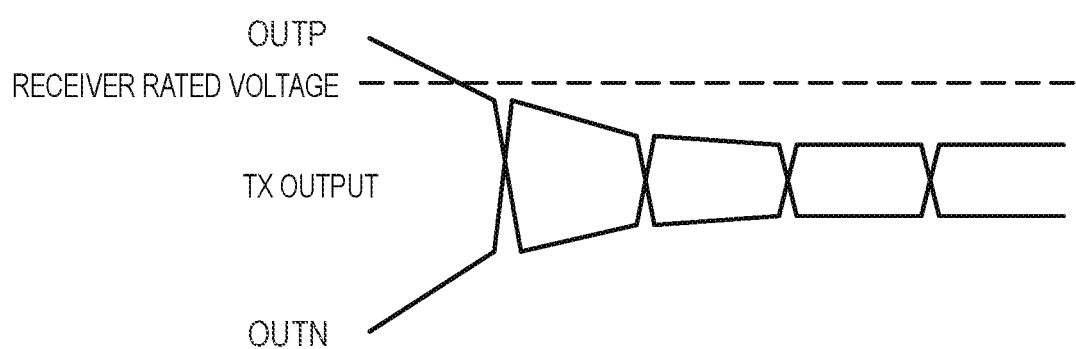
FIG. 6 is a diagram illustrating an object of the differential signal drive circuit according to the first reference example.

Thus, when the differential transmitter TX transitions from this state to the operating state, the voltage supplied to the power supply voltage terminal of the differential transmitter TX becomes higher than the voltage Vtx immediately after the transition. As a result, the High level of output data output from the differential transmitter TX is higher than a desired voltage as illustrated in FIG. 6, for example.

When the signal level of the output data is higher than the desired voltage, the rated voltage of a receiver that receives the data may be exceeded, and in the worst case, the receiver may fail. For example, the maximum rating of the receiver is highly likely to be exceeded when the voltage VDD of the power supply connected to the drain of the n-channel MOS transistor SF1 of the individual circuit unit 20 and a voltage VDDREC meet Equation (5) below, where the voltage VDDREC denotes the power supply voltage of the receiver.

$$VDD > VDDREC \qquad (5)$$

In this regard, in the differential signal drive circuit according to the present embodiment, the voltage VDDTX_I supplied to the differential transmitter TX is always the voltage Vtx, and the signal level of output data output from the differential transmitter TX can be always controlled within a desired voltage range. Therefore, the signal level of output data output from the differential transmitter TX would not exceed the rated voltage of the receiver, and a receiver failure due to a data signal output from the differential transmitter TX can be prevented.

Figure 7:
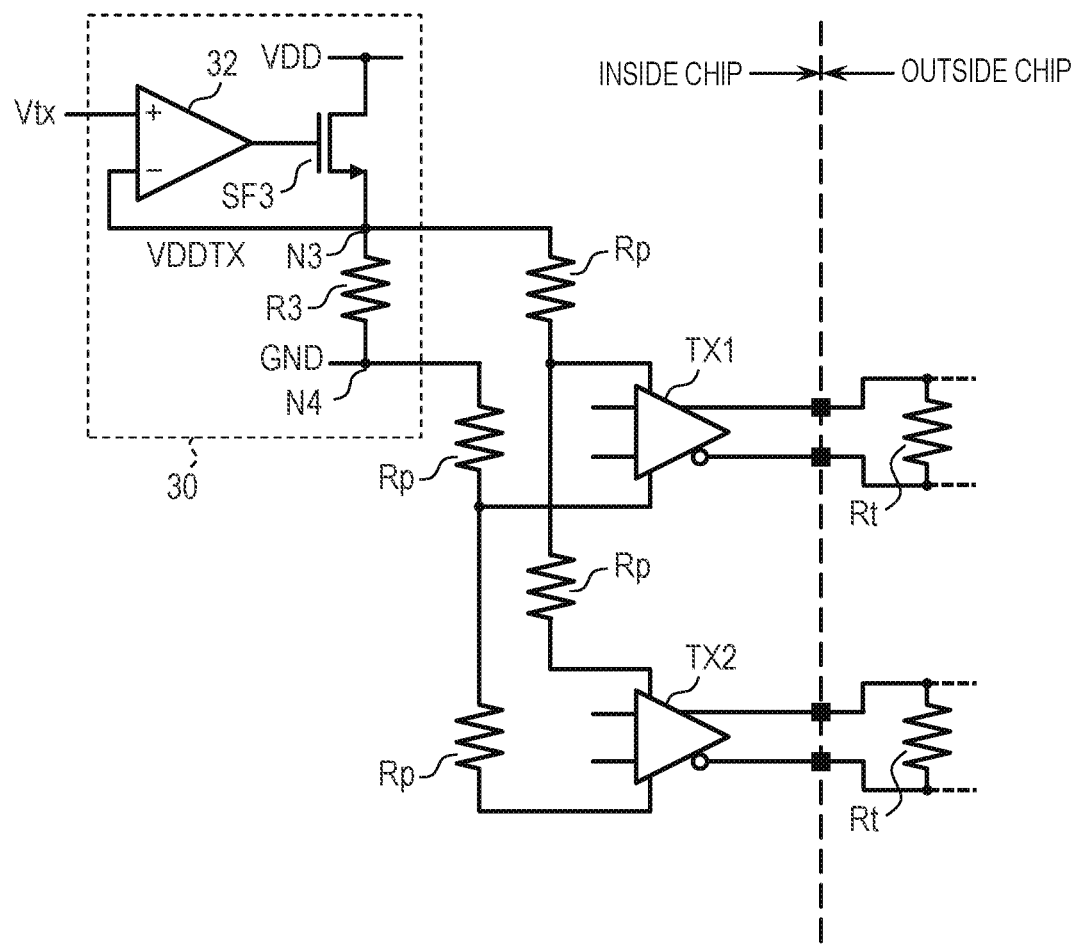
FIG. 7 is a circuit diagram illustrating a general configuration of a differential signal drive circuit according to a second reference example.

A differential signal drive circuit according to a second reference example illustrated in FIG. 7 is an example in which the voltage VDDTX is generated in a power supply voltage generation unit 30 and this voltage VDDTX is supplied to the differential transmitters TX1 and TX2 on respective lanes as a power supply voltage (voltage VDDTX_I). In FIG. 7, a differential transmitter TX1 close to the power supply voltage generation unit 30 and a differential transmitter TX2 distant from the power supply voltage generation unit 30 are assumed. Further, it is assumed here that the interconnection resistance of the power supply interconnection connected between the power supply voltage generation unit 30 and the differential transmitter TX1 is Rp and the interconnection resistance of the power supply interconnection connected between the power supply voltage generation unit 30 and the differential transmitter TX2 is 2Rp.

The power supply voltage generation unit 30 includes a differential amplifier circuit 32, an n-channel MOS transistor SF3, and a load resistor R3. The differential amplifier circuit 32 has two input terminals (a non-inverting input terminal (+) and an inverting input terminal (−)) and an output terminal. The voltage Vtx is supplied to the non-inverting input terminal of the differential amplifier circuit 32. The output terminal of the differential amplifier circuit 32 is connected to the gate of the n-channel MOS transistor SF3. The n-channel MOS transistor SF3 has the drain connected to the power supply voltage node (voltage VDD) and forms a source follower circuit. The source of the n-channel MOS transistor SF3 is connected to one terminal of the load resistor R3 and the inverting input terminal of the differential amplifier circuit 32. The other terminal of the load resistor R3 is connected to the reference voltage node (GND node).

Herein, the connection node of the source of the n-channel MOS transistor SF3, the one terminal of the load resistor R3, and the inverting input terminal of the differential amplifier circuit 32 is referred to as a node N3 for the purpose of illustration. Further, the other terminal of the load resistor R3 connected to the GND node is referred to as a node N4.

The voltage VDDTX of the node N3 is the same as the voltage Vtx as with the node N1 of the common circuit unit 10. The power supply voltage and the reference voltage are supplied from the node N3 and the node N4 to the differential transmitters TX1 and TX2 on respective lanes via interconnections, respectively.

When the differential transmitters TX1 and TX2 on each lane are operating, current is always flowing from the power supply voltage terminal to the reference voltage terminal. In the circuit example of the differential transmitter TX illustrated in FIG. 2, current Itx flowing from the power supply voltage terminal to the reference voltage terminal is expressed as Equation (6) below.

$$Itx = VDDTX\_I/(R1+Rt+R2) \qquad (6)$$

Further, the power supply voltages supplied from the power supply voltage generation unit 30 to the differential transmitters TX1 and TX2 are reduced by the interconnection resistances between the power supply voltage generation unit 30 and the differential transmitters TX1 and TX2. That is, the voltage VDDTX_I supplied from the power supply voltage generation unit 30 to the differential transmitter TX1 is expressed as Equation (7) below. Further, the voltage VDDTX_I supplied from the power supply voltage generation unit 30 to the differential transmitter TX2 is expressed as Equation (8) below.

$$VDDTX\_I = VDDTX - Rp \times Itx \qquad (7)$$

$$VDDTX\_I = VDDTX - 2 \times Rp \times Itx \qquad (8)$$

As described above, in the differential signal drive circuit according to the second reference example, the voltage supplied to the power supply voltage terminal will be lower for a differential transmitter TX that is more distant from the power supply voltage generation unit 30. Further, the same applies to the voltage on the GND node side, and the voltage supplied to the reference voltage terminal will be higher for a differential transmitter TX that is more distant from the power supply voltage generation unit 30.

Therefore, in the differential signal drive circuit according to the second reference example, the power supply voltage supplied to the differential transmitter TX is different in accordance with the lane, and thus the amplitude of the data signal output from the differential transmitter TX will be different between lanes.

In this regard, in the differential signal drive circuit according to the present embodiment, the voltage VDDTX is supplied from the power supply voltage node to the power supply voltage terminal of the differential transmitter TX via the n-channel MOS transistor SF1 on each lane, as illustrated in FIG. 1. Also in such a case, although a voltage drop occurs in the voltage VDD supplied to the individual circuit unit 20 on each lane due to the interconnection resistance of the power supply voltage interconnection, the voltage drop occurs at the drain of the n-channel MOS transistor SF1 forming a source follower circuit. When the n-channel MOS transistor SF1 is operating in a saturation region, since influence of a change in the drain voltage on the drain current is small, and influence on the voltage VDDTX supplied to the differential transmitter TX on each lane is small. Therefore, influence on the amplitude of a data signal output from the differential transmitter TX can also be reduced to be smaller than in the case of the differential signal drive circuit according to the second reference example. The influence on the voltage on the GND node side in the differential signal drive circuit according to the present embodiment is the same as the case of the differential signal drive circuit according to the second reference example.

Figure 8:
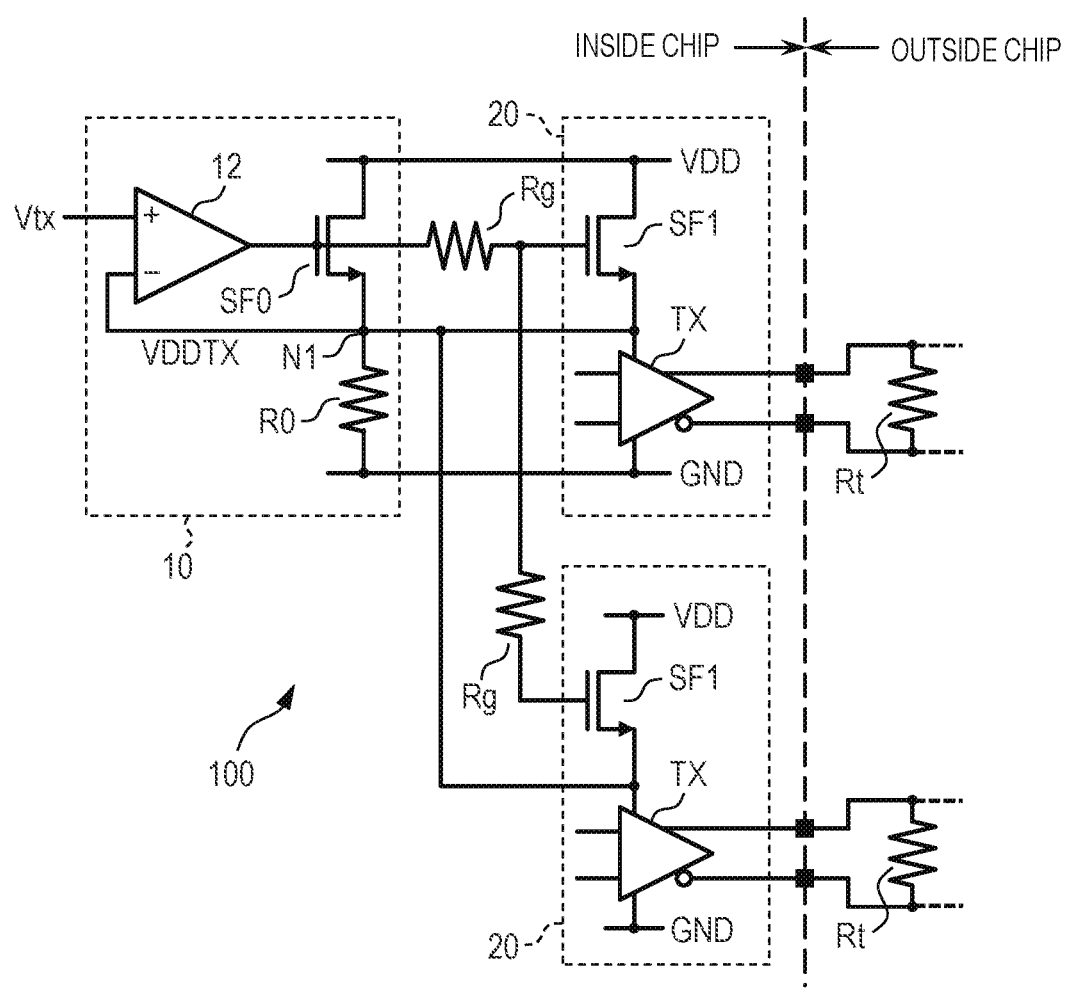
FIG. 8 is a circuit diagram illustrating a general configuration of a differential signal drive circuit according to a modified example of the first embodiment of the disclosure.

Note that, although the gate of the n-channel MOS transistor SF0 of the common circuit unit 10 and the gate of the n-channel MOS transistor SF1 of the individual circuit unit 20 are directly connected to each other in the present embodiment, these gates are not necessarily required to be directly connected to each other. For example, as illustrated in FIG. 8, the gate of the n-channel MOS transistor SF0 and the gate of the n-channel MOS transistor SF1 may be connected via a gate resistor Rg. Further, the gate of one n-channel MOS transistor SF1 of the individual circuit unit 20 and the gate of another n-channel MOS transistor SF1 of the individual circuit unit 20 may be connected via a gate resistor Rg. Also when the differential signal drive circuit is configured in such a way, the same advantageous effect as described in the present embodiment can be obtained. The gate resistor Rg may be configured by arranging a resistor element or may be configured by locally reducing the width of the interconnection to increase the interconnection resistance.

As described above, according to the present embodiment, a signal with a stable amplitude can be output even when an operation state of a differential signal drive circuit is switched. Accordingly, quality of a signal output from a differential transmitter can be improved. Further, a failure of a receiver that receives the signal from the differential transmitter can be prevented.

Second Embodiment

Figure 9:
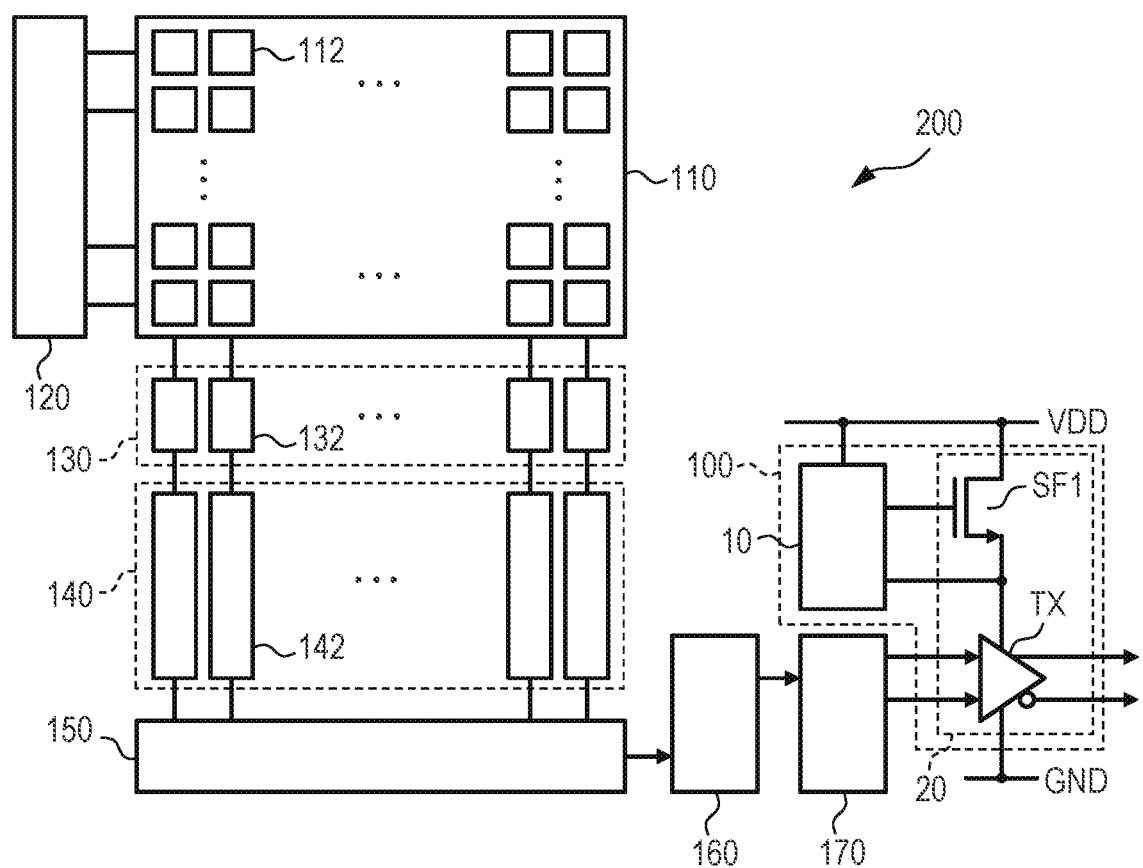
FIG. 9 is a block diagram illustrating a general configuration of a photoelectric conversion device according to a second embodiment of the disclosure.

A photoelectric conversion device according to a second embodiment of the disclosure will be described with reference to FIG. 9. The same components as those in the differential signal drive circuit according to the first embodiment are labeled with the same references, and the description thereof will be omitted or simplified. FIG. 9 is a block diagram illustrating a general configuration of the photoelectric conversion device according to the present embodiment.

While not particularly limited, the differential signal drive circuit 100 according to the first embodiment can be used as an output circuit unit of the photoelectric conversion device, for example. In the present embodiment, an example of a photoelectric conversion device to which the differential signal drive circuit according to the first embodiment is applied will be described.

As illustrated in FIG. 9, a photoelectric conversion device 200 according to the present embodiment includes a pixel region 110, a vertical scanning circuit 120, an AD conversion circuit unit 130, a memory unit 140, a horizontal scanning circuit 150, a calculation unit 160, a signal processing circuit 170, and the differential signal drive circuit 100.

In the pixel region 110, a plurality of pixels 112 arranged in a matrix so as to form a plurality of rows and a plurality of columns are provided. Each of the pixels 112 includes a photoelectric conversion unit formed of a photoelectric conversion element such as a photodiode and has a function of outputting a pixel signal in accordance with a light amount of incident light. The vertical scanning circuit 120 is a control circuit unit that supplies, to the pixels 112 via the control lines provided on respective rows of the pixel array, control signals used for driving the pixels 112 when reading out pixel signals from the pixel region 110.

The AD conversion circuit unit 130 includes a plurality of column AD conversion circuits 132 provided in association with respective columns of the pixel array. The column AD conversion circuit 132 converts an analog pixel signal output from the pixel 112 on a corresponding column into digital data. The memory unit 140 includes a plurality of column memories 142 provided in association with respective columns of the pixel array. The column memory 142 stores digital data converted by the column AD conversion circuit 132 on a corresponding column. The horizontal scanning circuit 150 sequentially selects the column memories 142 on respective columns and outputs digital data stored in the selected column memory 142 to the calculation unit 160.

The calculation unit 160 performs a predetermined calculation process, for example, an amplification process, a digital correlated double sampling (CDS) process, or the like on digital data transferred from the memory unit 140 and outputs the processed digital data to the signal processing circuit 170. The signal processing circuit 170 includes a parallel-to-serial conversion circuit, convers parallel data output from the calculation unit 160 into serial data, and outputs the converted serial data to the differential signal drive circuit 100.

The differential signal drive circuit 100 is the differential signal drive circuit 100 described in the first embodiment. The differential signal drive circuit 100 converts serial data received from the signal processing circuit 170 into a differential signal and outputs the differential signal to the outside of the photoelectric conversion device 200 via the differential transmitter TX. Note that only one individual circuit unit 20 corresponding to one lane of the plurality of individual circuit units 20 forming the differential signal drive circuit 100 is illustrated in FIG. 9 to simplify the drawing. The power supply voltage is supplied to the differential transmitter TX by the individual circuit unit 20. Further, the voltages supplied to the gate and the source of the n-channel MOS transistor of the individual circuit unit 20 are generated by the common circuit unit 10.

By applying the differential signal drive circuit 100 of the first embodiment to the signal output unit of the photoelectric conversion device, a signal output from the differential transmitter TX can be controlled to be always within a desired range. Accordingly, quality of a signal can be improved, and destruction of a receiver that receives the signal can be prevented. Further, since the power supply voltage of the differential transmitter TX is generated inside a chip, no power supply IC is required outside the chip. Accordingly, the number of components can be reduced, and cost can be reduced.

Third Embodiment

Figure 10:
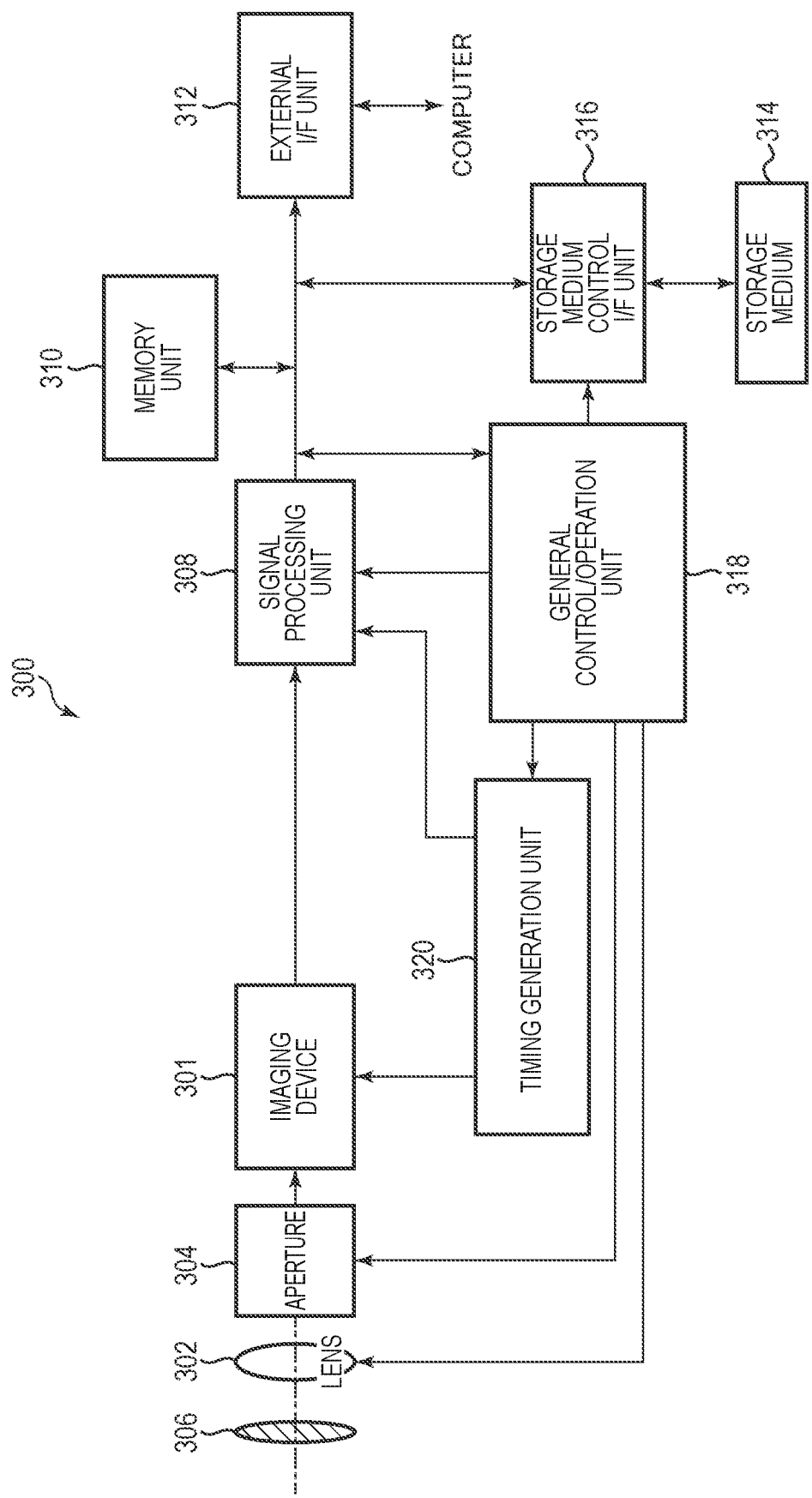
FIG. 10 is a block diagram illustrating a general configuration of an imaging system according to a third embodiment of the disclosure.

An imaging system according to a third embodiment of the disclosure will be described with reference to FIG. 10. FIG. 10 is a block diagram illustrating a general configuration of the imaging system according to the present embodiment.

The photoelectric conversion device 200 described in the above second embodiment can be applied to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 10 illustrates a block diagram of a digital still camera as an example out of these examples.

An imaging system 300 illustrated as an example in FIG. 10 includes an imaging device 301, a lens 302 that captures an optical image of an object onto the imaging device 301, an aperture 304 for changing a light amount passing through the lens 302, and a barrier 306 for protecting the lens 302. The lens 302 and the aperture 304 form an optical system that converges a light onto the imaging device 301. The imaging device 301 is the photoelectric conversion device 200 described in the second embodiment and converts an optical image captured by the lens 302 into image data.

Further, the imaging system 300 includes a signal processing unit 308 that processes an output signal output from the imaging device 301. The signal processing unit 308 generates image data from digital signals output by the imaging device 301. Further, the signal processing unit 308 performs operations of performing various correction or compression to output image data, if necessary. The imaging device 301 may have an AD conversion unit that generates a digital signal processed in the signal processing unit 308. The AD conversion unit may be formed in a semiconductor layer (a semiconductor substrate) in which the photoelectric conversion unit of the imaging device 301 is formed or may be formed on a different semiconductor substrate from the semiconductor layer in which the photoelectric conversion unit of the imaging device 301 is formed. Further, the signal processing unit 308 may be formed on the same semiconductor substrate as the imaging device 301.

Furthermore, the imaging system 300 includes a memory unit 310 for temporarily storing image data therein and an external interface unit (external I/F unit) 312 for communicating with an external computer or the like. The imaging system 300 further includes a storage medium 314 such as a semiconductor memory for performing storage or readout of imaging data and a storage medium control interface unit (storage medium control I/F unit) 316 for performing storage or readout on the storage medium 314. Note that the storage medium 314 may be embedded in the imaging system 300 or may be removable.

Furthermore, the imaging system 300 includes a general control/operation unit 318 that performs various calculation and controls the entire digital still camera and a timing generation unit 320 that outputs various timing signals to the imaging device 301 and the signal processing unit 308. Here, the timing signal or the like may be input from the outside, and the imaging system 300 may have at least the imaging device 301 and the signal processing unit 308 that processes an output signal output from the imaging device 301.

The imaging device 301 outputs an imaging signal to the signal processing unit 308. The signal processing unit 308 performs predetermined signal processing on an imaging signal output from the imaging device 301 and outputs image data. The signal processing unit 308 uses an imaging signal to generate an image.

As described above, according to the present embodiment, the imaging system to which the photoelectric conversion device 200 according to the second embodiment is applied can be realized.

Fourth Embodiment

Figure 11A:
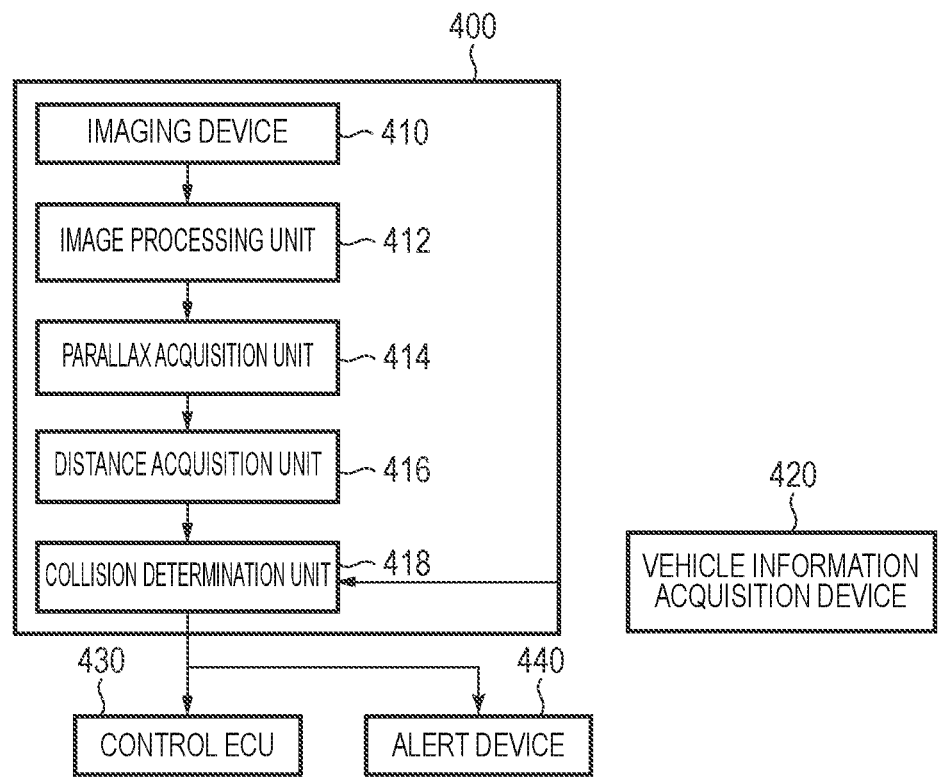
FIG. 11A is a diagram illustrating a configuration example of an imaging system according to a fourth embodiment of the disclosure.
Figure 11B:
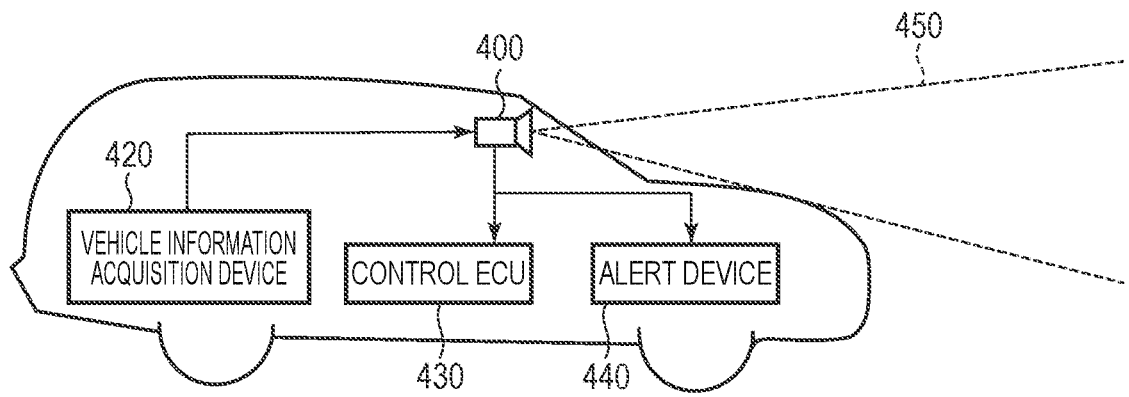
FIG. 11B is a diagram illustrating a configuration example of a movable object according to the fourth embodiment of the disclosure.

An imaging system and a movable object according to a fourth embodiment of the disclosure will be described with reference to FIG. 11A and FIG. 11B. FIG. 11A is a diagram illustrating a configuration of the imaging system according to the present embodiment. FIG. 11B is a diagram illustrating a configuration of the movable object according to the present embodiment.

FIG. 11A illustrates an example of an imaging system related to an on-vehicle camera. An imaging system 400 includes an imaging device 410. The imaging device 410 is the photoelectric conversion device 200 described in the above second embodiment. The imaging system 400 includes an image processing unit 412 that performs image processing on a plurality of image data acquired by the imaging device 410 and a parallax acquisition unit 414 that calculates a parallax (a phase difference of parallax images) from the plurality of image data acquired by the imaging system 400. Further, the imaging system 400 includes a distance acquisition unit 416 that calculates a distance to the object based on the calculated parallax and a collision determination unit 418 that determines whether or not there is a collision possibility based on the calculated distance. Here, the parallax acquisition unit 414 and the distance acquisition unit 416 are an example of a distance information acquisition unit that acquires distance information on the distance to the object. That is, the distance information is information on a parallax, a defocus amount, a distance to an object, or the like. The collision determination unit 418 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like or may be implemented by a combination thereof.

The imaging system 400 is connected to the vehicle information acquisition device 420 and can acquire vehicle information such as a vehicle speed, a yaw rate, a steering angle, or the like. Further, the imaging system 400 is connected to a control ECU 430, which is a control device that outputs a control signal for causing a vehicle to generate braking force based on a determination result by the collision determination unit 418. Further, the imaging system 400 is also connected to an alert device 440 that issues an alert to the driver based on a determination result by the collision determination unit 418. For example, when the collision probability is high as the determination result of the collision determination unit 418, the control ECU 430 performs vehicle control to avoid a collision or reduce damage by applying a brake, pushing back an accelerator, suppressing engine power, or the like. The alert device 440 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 400. FIG. 11B illustrates the imaging system when a front area of a vehicle (a capturing area 450) is captured. The vehicle information acquisition device 420 transmits an instruction to the imaging system 400 or the imaging device 410. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

MODIFIED EMBODIMENTS

The disclosure is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is also one of the embodiments of the disclosure.

Further, the power supply voltage supplied to the differential amplifier circuit 12 of the common circuit unit 10 and the power supply voltage supplied to the n-channel MOS transistor SF0 of the common circuit unit 10 and the n-channel MOS transistor SF1 of the individual circuit unit 20 may be the same or may be different from each other. For example, the power supply voltage supplied to the differential amplifier circuit 12 may be set to a voltage higher than the power supply voltage supplied to the n-channel MOS transistors SF0 and SF1.

Further, the reference voltage of the differential amplifier circuit 12 of the common circuit unit 10 and the reference voltage of the differential transmitter TX may be the same or may be different from each other.

Further, although both the power supply voltage supplied to the n-channel MOS transistor SF0 of the common circuit unit 10 and the power supply voltage supplied to the n-channel MOS transistor SF1 of the individual circuit unit 20 are the voltage VDD in the embodiments described above, these power supply voltages may be different from each other.

Further, although the example in which the power supply circuit and the differential transmitter are formed using n-channel MOS transistors has been illustrated in the above embodiments, the power supply circuit or the differential transmitter can be formed using p-channel MOS transistors.

Further, the photoelectric conversion device illustrated in the above second embodiment is provided as an example of a photoelectric conversion device to which the differential signal drive circuit of the first embodiment may be applied, and a device to which this differential signal drive circuit can be applied is not limited to the configuration illustrated in FIG. 9.

Further, the imaging systems illustrated in the above third and fourth embodiments are provided as examples of an imaging system to which the photoelectric conversion device of the second embodiment may be applied, and an imaging system to which the photoelectric conversion device can be applied is not limited to the configuration illustrated in FIG. 10 and FIG. 11A.

While the disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An apparatus comprising:
    a plurality of differential transmitters corresponding to a plurality of lanes; and
    a power supply circuit that supplies a power supply voltage to each of the plurality of differential transmitters,
    wherein the power supply circuit includes:
        a common circuit unit that defines the power supply voltage supplied to the plurality of differential transmitters, and
        a plurality of individual circuit units provided in association with the plurality of differential transmitters and each connected to the common circuit unit,
    wherein each of the plurality of individual circuit units includes a first transistor that forms a source follower circuit and outputs the power supply voltage defined by the common circuit unit, and has an output node that outputs the power supply voltage to a corresponding differential transmitter of the plurality of differential transmitters,
    wherein the common circuit unit includes:
        a differential amplifier circuit including a non-inverting input terminal, an inverting input terminal, and an output terminal,
        a second transistor that forms the source follower circuit and whose gate is connected to the output terminal of the differential amplifier circuit, and
        a load element connected between a source of the second transistor and a reference voltage node,
    wherein the output node of one of the plurality of individual circuit units and the output node of another of the plurality of individual circuit units are connected to each other, and
    wherein the output node of each of the plurality of individual circuit units is connected to a connection node between the source of the second transistor and the load element.

2. The apparatus according to claim 1, wherein in the differential amplifier circuit, a reference voltage is supplied to the non-inverting input terminal, and the inverting input terminal is connected to the connection node.

3. The apparatus according to claim 1, wherein the load element is a resistor.

4. The apparatus according to claim 1, wherein the load element is a current source.

5. The apparatus according to claim 1, wherein a gate of the first transistor is connected to the output terminal of the differential amplifier circuit and the gate of the second transistor.

6. The apparatus according to claim 1, wherein a gate of the first transistor and the gate of the second transistor are connected via a resistor.

7. The apparatus according to claim 1, wherein a power supply voltage supplied to the differential amplifier circuit and a power supply voltage supplied to the source follower circuit are different from each other.

8. The apparatus according to claim 1, wherein a gate of the first transistor of one of the plurality of individual circuit units and a gate of the first transistor of another of the plurality of individual circuit units are connected via a resistor.

9. A photoelectric conversion device comprising:
    a pixel that outputs a signal in accordance with a light amount of incident light; and
    an output circuit unit that externally outputs a signal output from the pixel,
    wherein the output circuit unit includes the apparatus according to claim 1.

10. An imaging system comprising:
    the photoelectric conversion device according to claim 9; and
    a signal processing unit that processes a signal output from the photoelectric conversion device.

11. A movable object comprising:

the photoelectric conversion device according to claim 9;

a distance information acquisition unit that acquires distance information on a distance to an object, from a parallax image based on signals output from the photoelectric conversion device; and a control unit that controls the movable object based on the distance information.

12. An apparatus comprising:

a plurality of differential transmitters corresponding to a plurality of lanes; and a power supply circuit that supplies a power supply voltage to each of the plurality of differential transmitters, wherein the power supply circuit includes:
   a common circuit unit that defines the power supply voltage supplied to the plurality of differential transmitters, and
   a plurality of individual circuit units provided in association with the plurality of differential transmitters and each connected to the common circuit unit, wherein each of the plurality of individual circuit units has an output node that outputs the power supply voltage defined by the common circuit unit to a corresponding differential transmitter of the plurality of differential transmitters, and wherein the output node of one of the plurality of individual circuit units and the output node of another of the plurality of individual circuit units are connected to each other wherein each of the plurality of differential transmitters includes:
   a power supply voltage terminal to which the power supply voltage is supplied from the power supply circuit,
   a first resistor whose one terminal is connected to the power supply voltage terminal,
   a third transistor and a fourth transistor whose drains are connected to the other terminal of the first resistor,
   a fifth transistor whose drain is connected to a source of the third transistor,
   a sixth transistor whose drain is connected to a source of the fourth transistor,
   a second resistor whose one terminal is connected to a source of the fifth transistor and a source of the sixth transistor, and
   a reference voltage terminal connected to the other terminal of the second resistor, wherein a first node to which a gate of the third transistor and a gate of the sixth transistor are connected and a second node to which a gate of the fourth transistor and a gate of the fifth transistor are connected form a pair of differential input terminals, and wherein a third node to which the source of the third transistor and the drain of the fifth transistor are connected and a fourth node to which the source of the fourth transistor and the drain of the sixth transistor are connected form a pair of differential output terminals.

13. A power supply circuit comprising:

a common circuit unit that defines a power supply voltage supplied to a plurality of differential transmitters; and a plurality of individual circuit units provided in association with the plurality of differential transmitters and each connected to the common circuit unit, wherein each of the plurality of individual circuit units includes a first transistor that forms a source follower circuit and outputs the power supply voltage defined by the common circuit unit, and has an output node that outputs the power supply voltage to a corresponding one of the plurality of differential transmitters, wherein the common circuit unit includes
   a differential amplifier circuit including a non-inverting input terminal, an inverting input terminal, and an output terminal,
   a second transistor that forms the source follower circuit and whose gate is connected to the output terminal of the differential amplifier circuit, and
   a load element connected between a source of the second transistor and a reference voltage node, wherein the output node of one of the plurality of individual circuit units and the output node of another of the plurality of individual circuit units are connected to each other, and wherein the output node of each of the plurality of individual circuit units is connected to a connection node between the source of the second transistor and the load element.

14. The power supply circuit according to claim 13, wherein in the differential amplifier circuit, a reference voltage is supplied to the non-inverting input terminal, and the inverting input terminal is connected to the connection node.

15. The power supply circuit according to claim 13, wherein a gate of the first transistor is connected to the output terminal of the differential amplifier circuit and the gate of the second transistor.

* * * * *